United States Patent
Wong

(10) Patent No.: US 6,997,580 B2
(45) Date of Patent: Feb. 14, 2006

(54) MULTIDIRECTIONAL LIGHT EMITTING DIODE UNIT

(75) Inventor: Yeung Chung Wong, Tuen Mun (CN)

(73) Assignee: Mattel, Inc., El Segundo, CA (US)

( * ) Notice: Subject to any disclaimer, the term of this patent is extended or adjusted under 35 U.S.C. 154(b) by 0 days.

(21) Appl. No.: 10/944,923

(22) Filed: Sep. 17, 2004

(65) Prior Publication Data

US 2005/0063188 A1   Mar. 24, 2005

Related U.S. Application Data

(60) Provisional application No. 60/504,408, filed on Sep. 19, 2003.

(51) Int. Cl.
  *F21V 3/02* (2006.01)
(52) U.S. Cl. ................... 362/311; 362/555; 257/98; 313/110
(58) Field of Classification Search ............... 362/555, 362/327, 397, 298, 311, 316, 551, 582, 257; 362/296, 299, 307–309, 317, 326, 332, 339, 362/800; 257/98, 100, 79, 99, 787; 385/147; 313/512, 483, 498, 110; 116/200, 202; D16/137; D26/122, 120, 24, 113, 118
See application file for complete search history.

(56) References Cited

U.S. PATENT DOCUMENTS

| | | | |
|---|---|---|---|
| 1,081,215 A * | 12/1913 | Coulson ..................... | 362/327 |
| 2,362,176 A * | 11/1944 | Swanson .................... | 313/110 |
| 2,724,766 A | 11/1955 | Hawley et al. | |
| D204,319 S * | 4/1966 | Stewart ..................... | D16/137 |
| D206,956 S * | 2/1967 | Stewart ..................... | D16/137 |
| 3,676,668 A * | 7/1972 | Collins et al. .............. | 313/512 |
| 3,764,862 A * | 10/1973 | Jankowski .................. | 257/98 |
| 3,774,021 A | 11/1973 | Johnson | |
| 3,863,075 A * | 1/1975 | Ironmonger et al. ......... | 313/512 |
| 4,255,688 A * | 3/1981 | Nagasawa ................... | 313/499 |
| 4,638,343 A * | 1/1987 | Althaus et al. .............. | 257/98 |
| 4,698,730 A * | 10/1987 | Sakai et al. ................. | 362/311 |
| 4,920,404 A * | 4/1990 | Shrimali et al. ............. | 257/98 |
| 5,013,144 A | 5/1991 | Silverglate et al. | |
| 5,140,220 A | 8/1992 | Hasegawa | |
| 5,567,037 A | 10/1996 | Ferber | |
| 5,825,051 A * | 10/1998 | Bauer et al. ................ | 257/100 |
| 5,865,529 A * | 2/1999 | Yan ........................... | 362/327 |
| 5,898,267 A | 4/1999 | McDermott | |
| 5,931,570 A | 8/1999 | Yamuro | |
| 5,939,996 A | 8/1999 | Kniveton et al. | |
| 6,328,456 B1 * | 12/2001 | Mize ......................... | 362/311 |

(Continued)

*Primary Examiner*—Thomas M. Sember
*Assistant Examiner*—Ismael Negron
(74) *Attorney, Agent, or Firm*—Akin Gump Strauss Hauer & Feld, LLP

(57) ABSTRACT

A multidirectional light emitting diode unit includes a light emitting diode chip configured to emit light from at least one side of the chip when powered. An at least translucent casing extends from at least the one side of the light emitting diode chip. A distal end of the casing has at least two protrusions. Each protrusion has a substantially flat distal end surface facing outwardly away from the light emitting diode chip and inwardly toward a centerline of a cylindrical sidewall to form a recess between the protrusions within the distal end of the casing. Light from the light emitting diode chip is internally reflected by the sidewall and directed outwardly from the casing through the flat surfaces along output directions normal thereto.

7 Claims, 4 Drawing Sheets

U.S. PATENT DOCUMENTS

| | | |
|---|---|---|
| 6,361,190 B1 | 3/2002 | McDermott |
| 6,488,392 B1 | 12/2002 | Lu |
| 6,598,998 B1 | 7/2003 | West et al. |
| 6,607,286 B1 | 8/2003 | West et al. |
| 6,674,096 B1 * | 1/2004 | Sommers ............ 257/98 |
| 6,679,621 B1 | 1/2004 | West et al. |

* cited by examiner

MULTIDIRECTIONAL LIGHT EMITTING DIODE UNIT

CROSS-REFERENCE TO RELATED APPLICATIONS

This application claims the benefit of U.S. Provisional Patent Application No. 60/504,408, filed Sep. 19, 2003, entitled "Multidirectional Light Emitting Diode Unit".

BACKGROUND OF THE INVENTION

This invention generally relates to light emitting diodes and, more particularly, to light emitting diode units which produce beams of light that extend in multiple output directions.

Light emitting diodes (LEDs) are generally well-known and are used in various applications, including message displays, such as public information signs; status indicators, such as on/off lights; traffic signals; bicycle lighting; flashlights; backlights for liquid crystal displays (LCDs); signaling/emergency beacons and strobes; infrared remote controllers; sensors; and LED printers. LEDs typically have a cylindrical casing having a dome-shaped top, which emit light upwardly in a single direction, generally along a longitudinal central axis of the casing. Although such a field of illumination is appropriate in many instances, some applications would be better served if a LED was used that was capable of emitting light in multiple directions. Therefore, for such applications, it would be desirable to have a LED capable of emitting light therefrom in multiple output directions.

BRIEF SUMMARY OF THE INVENTION

Briefly stated, the present invention is a multidirectional light emitting diode unit comprising a light emitting diode chip configured to emit light from at least one side of the chip when powered. An at least translucent casing extends from at least the one side of the light emitting diode chip. The casing has a distal end opposite and most remote from the one side of the light emitting diode chip and a substantially cylindrical sidewall extending up to the distal end. The distal end of the casing has at least two protrusions. Each protrusion has a substantially flat distal end surface facing outwardly away from the light emitting diode chip and inwardly toward a centerline of the cylindrical sidewall to form a recess between the protrusions within the distal end of the casing. Light from the light emitting diode chip is internally reflected by the sidewall and directed outwardly from the casing through the flat surfaces along output directions normal thereto.

BRIEF DESCRIPTION OF THE SEVERAL VIEWS OF THE DRAWINGS

The foregoing summary, as well as the following detailed description of the preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

In the drawings:

FIG. 1b is a side elevational view of the diode unit of FIG. 1a;

FIG. 1c is a front elevational view of the diode unit of FIG. 1a;

FIG. 2 is a top perspective view of the diode unit of FIG. 1a;

FIG. 3 is a chart depicting luminous intensity of the diode unit of FIG. 1a;

DETAILED DESCRIPTION OF THE INVENTION

Figure 1A:
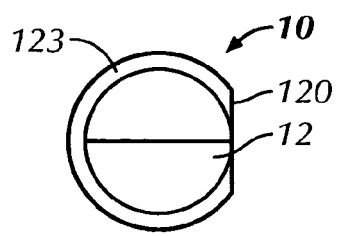
FIG. 1a is a top plan view of a multidirectional light emitting diode unit in accordance with a first embodiment of the present invention.
Figure 1B:
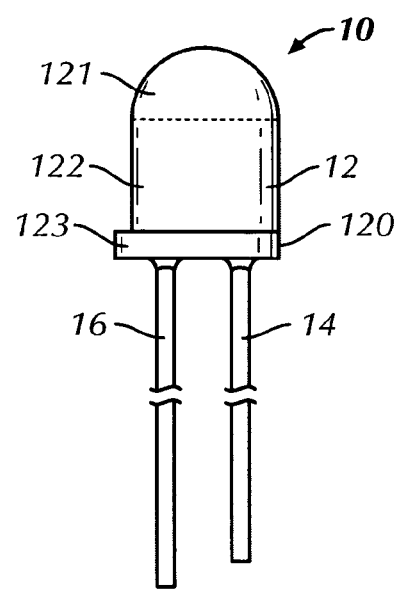

Certain terminology is used in the following description for convenience only and is not limiting. The words "right", "left", "upper" and "lower" designate directions in the drawings to which reference is made. The terminology includes the words above specifically mentioned, derivatives thereof, and words of similar import.

Referring to the drawings in detail, wherein like numerals indicate like elements throughout, there are shown in FIGS. 1–3 and 5 a preferred embodiment of a multidirectional light emitting diode unit, indicated generally at 10, in accordance with the present invention. Referring to FIGS. 1a, 1b, 1c, and 2, a first embodiment of the diode unit 10 comprises a light emitting diode chip 20 having an at least translucent plastic light tube or casing 12 extending from at least one side of the light emitting diode chip 20. Preferably, the casing 12 completely surrounds the light emitting diode chip 20. The casing 12 is preferably transparent and is preferably made of epoxy, although it is within the spirit and scope of the present invention that the casing 12 be made of another translucent or transparent material.

The shape of the casing 12 of the first embodiment of the present invention is essentially a generally cylindrical shape. The casing 12 has a distal end 121, which is a top end in the figures, most remote from the light emitting diode chip 20 and a substantially cylindrical sidewall 122 extending up to the distal end 121. The distal end 121 of the casing 12 has first and second protrusions 12a, 12b. Each of the first and second protrusions 12a, 12b preferably has a substantially flat distal end surface facing outwardly/upwardly away from the light emitting diode chip 20 and inwardly toward a centerline of the cylindrical sidewall 122 to form a recess between the protrusions 12a, 12b within the distal end 121 of the casing 12.

Figure 1C:
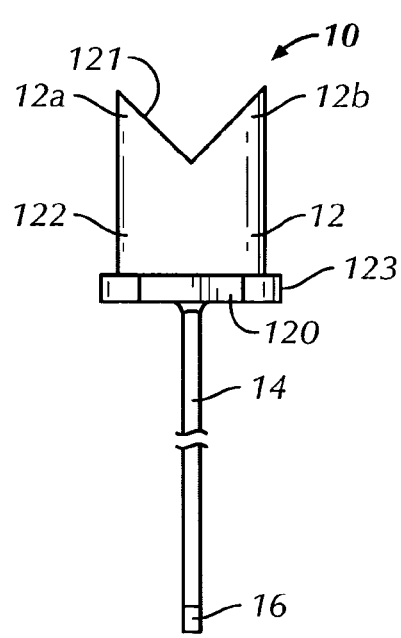
Figure 2:
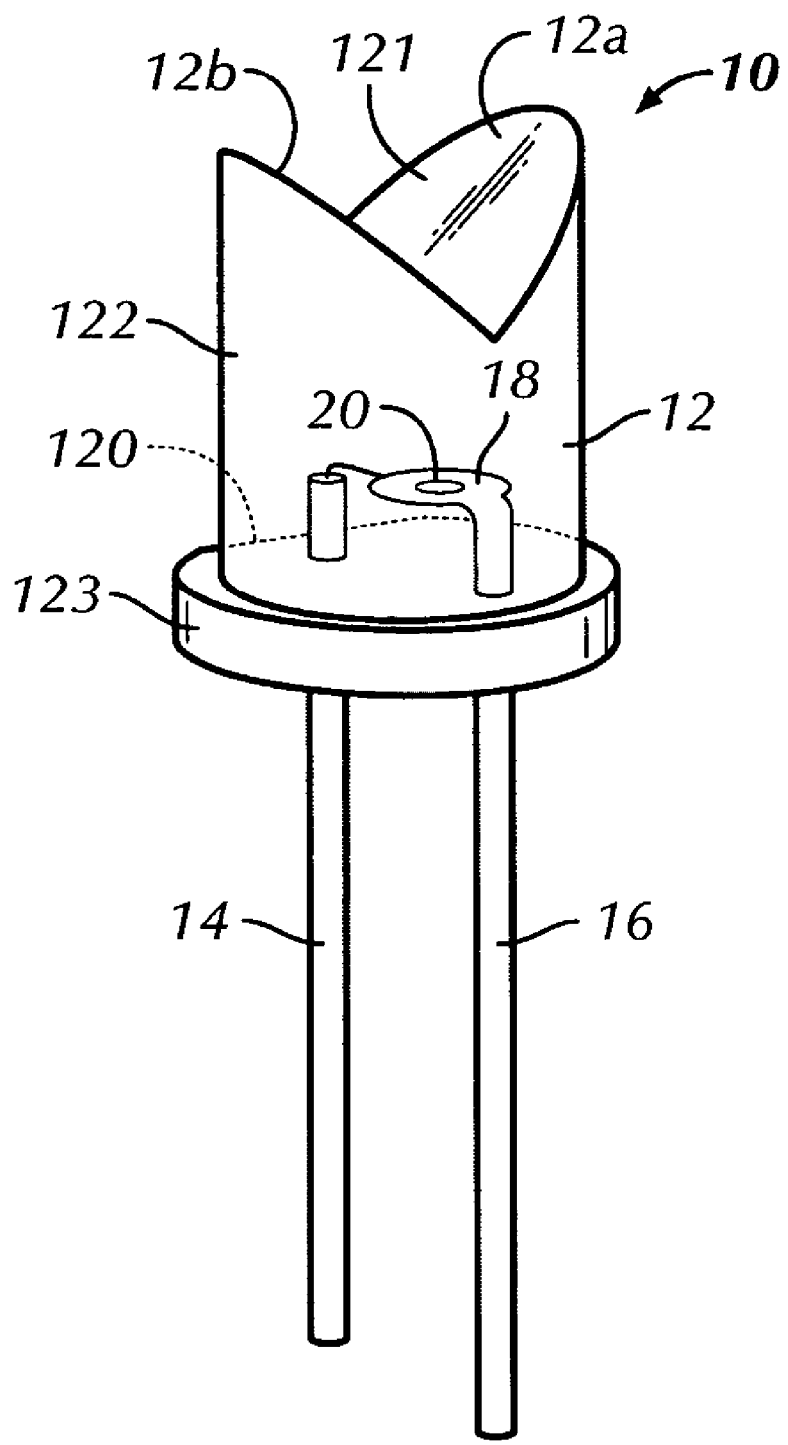

Preferably, a V-shaped notch is formed in the distal end 121 of the casing 12 between the first and second protrusions 12a, 12b (see specifically FIGS. 1c and 2). In order to ensure proper operation of the diode unit 10, it is preferable that the casing 12 be molded to such a shape and not cut or cut and polished to that shape. The flat surfaces of the first and second protrusions 12a, 12b preferably have an angle of about ninety degrees therebetween. Although it is preferred that the flat surfaces of the protrusions 12a, 12b be about ninety degrees apart, it is within the spirit and scope of the present invention that the surfaces oriented at a different angle as long as the diode unit 10 is able to function in the manner described below.

The light emitting diode chip 20 is configured to emit light from at least one side thereof when powered. The chip 20 is powered by any conventional power source (not shown), such as a battery or other equivalent power source, connected across negative and positive leads 14, 16. The negative lead 14 is identified as being the shorter of the two leads and is located proximate a flat region 120 of the casing 12. The leads 14, 16 are preferably flat, conductive elongated pieces of metal which extend from either side of the chip 20 through the bottom of the casing 12. The positive lead 16 extends from the p region (not shown) of the chip 20 and the negative lead 14 extends from the n region (not shown) of the chip 20. Connecting power across the leads 14, 16 causes the chip 20 to emit light.

The light emitting diode chip 20 is a semiconductor chip, the structure of which is generally known in the industry. The light emitting diode chip 20 is preferably disposed proximate a proximal end 123 of the casing 12, which is opposite and most remote from the distal end 121. Preferably, a reflector 18 is disposed proximate to a remaining side of the light emitting diode chip 20, facing away from the one side of the light emitting diode chip 20 and away from the distal end 121 of the casing 12. The reflector 18 is preferably formed from a highly reflective piece of metal, which is positioned to amplify and reflect light emitted from the light emitting diode chip 20 upwardly toward the distal end 121 of the casing 12.

Figure 3:
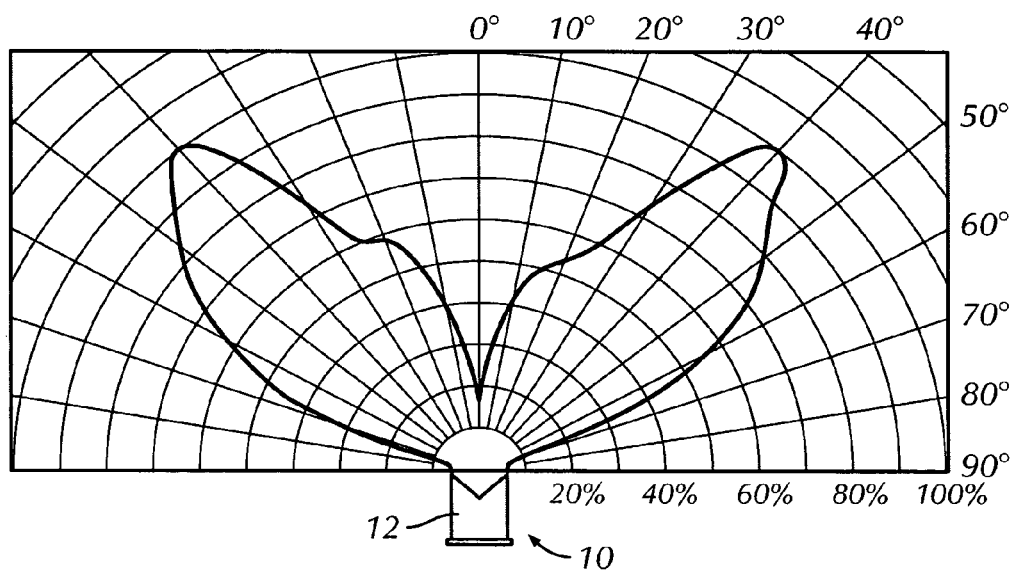

Referring now to FIG. 3, the geometry of the casing 12 causes light emitted by the light emitting diode chip 20 to be internally reflected by the sidewall 122 and directed outwardly from the casing 12 through the flat surfaces of the first and second protrusions 12a, 12b along output directions, which are generally normal to the flat surfaces of the protrusions 12a, 12b. The output directions of light emitted from the diode unit 10 can be seen to radiate outwardly from the distal end 121 of the casing 12 in two patches of heightened luminous intensity corresponding with and normal to the flat surfaces of the protrusions 12a, 12b, so as to form a light pattern from the distal end 121 of the casing 12 that is substantially V-shaped. In this way, it is possible to produce light radiating in multiple output directions and multiple angles from a single diode unit 10.

Figure 4:
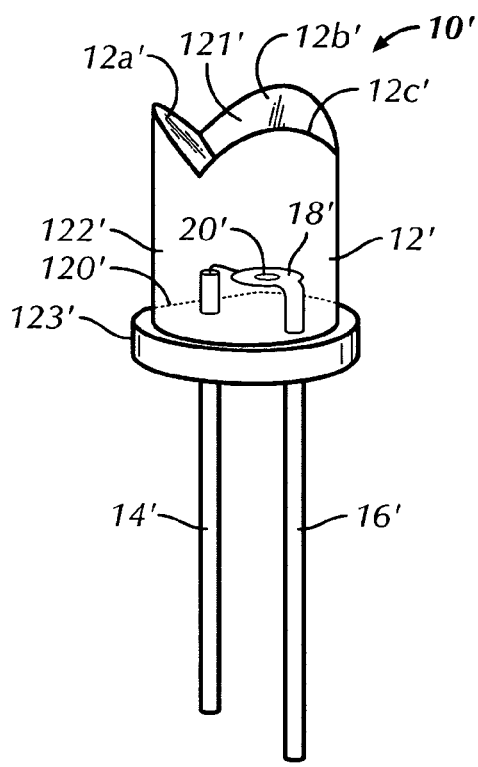
FIG. 4 is a perspective view of a multidirectional light emitting diode unit in accordance with a second embodiment of the present invention.

Referring to FIG. 4, a diode unit 10', corresponding to a second embodiment of the present invention, can be seen. The diode unit 10' is essentially similar to the diode unit 10 of the first embodiment with the exception of the shape of the casing 12'. The shape of the casing 12' is essentially a cylinder having an inverted triangular pyramid recess in a distal end 121', thereby forming first, second, and third protrusions 12a', 12b', 12c'. Each protrusion 12a', 12b', 12c' has a flat upwardly and inwardly facing surface corresponding to one of the faces of the inverted triangular pyramid recess. Preferably, the flat surfaces of the protrusions 12a', 12b', 12c' are oriented at sixty degrees to each other, although it is within the spirit and scope of the present invention that the flat surfaces be at any orientation with respect to each other. The diode 10' works in essentially the same manner as the diode 10 of the first embodiment except that light is now emitted in three output directions corresponding to and normal to the flat surfaces of the protrusions 12a', 12b', 12c'.

Figure 5:
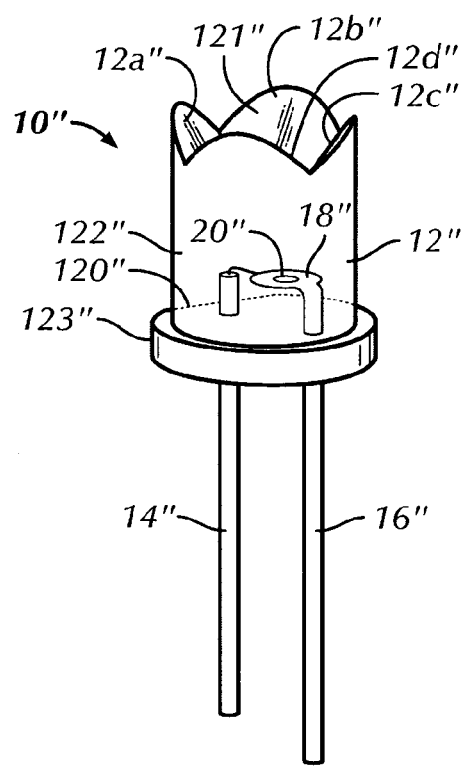
FIG. 5 is a perspective view of a multidirectional light emitting diode unit in accordance with a third embodiment of the present invention.

Referring to FIG. 5, a diode unit 10", corresponding to a third embodiment of the present invention, can be seen. The unit 10" is essentially similar to the diode 10 of the first embodiment with the exception of the shape of a casing 12". The shape of the casing 12" is essentially a cylinder having an inverted square pyramid recess in a distal end 121", thereby forming first, second, third, and fourth protrusions 12a", 12b", 12c", and 12d". Each protrusion 12a", 12b", 12c", and 12d" has a flat upwardly and inwardly facing surface, the flat surfaces being oriented at ninety degrees to each other. The diode 10" works in essentially the same manner as the diode 10 of the first embodiment except that light is now emitted in four output directions corresponding to and normal to the flat surfaces of the protrusions 12a", 12b", 12c", and 12d".

In this way, the light emitting diode units 10, 10', 10" of the present invention can be used to direct light in multiple directions from the distal ends 121, 121', 121" thereof without being required to use multiple light emitting diode units.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A multidirectional light emitting diode unit, comprising:
   a light emitting diode chip configured to emit light from at least one side of the chip when powered; and
   an at least translucent casing extending from at least the one side of the light emitting diode chip, the casing having a distal end opposite and most remote from the one side of the light emitting diode chip and a substantially cylindrical sidewall extending up to the distal end, the distal end of the casing having at least two protrusions, each protrusion having a substantially flat distal end surface facing outwardly away from the light emitting diode chip and inwardly toward a centerline of the cylindrical sidewall to form a recess between the protrusions within the distal end of the casing, wherein light from the light emitting diode chip is internally reflected by the sidewall and directed outwardly from the casing through the flat surfaces along output directions normal thereto.

2. The multidirectional light emitting diode unit of claim 1, wherein the casing is transparent.

3. The multidirectional light emitting diode unit of claim 1, wherein the casing includes two protrusions forming a V-shaped notch therebetween so as to produce a light pattern from the distal end of the casing that is substantially V-shaped.

4. The multidirectional light emitting diode unit of claim 1, wherein the casing includes three protrusions forming a recess therebetween in the shape of an inverted triangular pyramid.

5. The multidirectional light emitting diode unit of claim 1, wherein the casing includes four protrusions forming a recess therebetween in the shape of an inverted square pyramid.

6. The multidirectional light emitting diode unit of claim 1, further comprising a reflector disposed proximate to a remaining side of the light emitting diode chip, facing away from the one side of the light emitting diode chip and away from the distal end of the casing, the reflector positioned to reflect light emitted from the light emitting diode chip toward the distal end of the casing.

7. The multidirectional light emitting diode unit of claim 1, wherein the chip is disposed proximate a proximal end of the casing opposite the distal end.

* * * * *